United States Patent
Li et al.

(10) Patent No.: US 10,541,110 B2
(45) Date of Patent: *Jan. 21, 2020

(54) APPARATUS OF PLURAL CHARGED-PARTICLE BEAMS

(71) Applicant: ASML Netherlands B.V., Veldhoven (NL)

(72) Inventors: Shuai Li, Beijing (CN); Weiming Ren, San Jose, CA (US); Xuedong Liu, San Jose, CA (US); Juying Dou, San Jose, CA (US); Xuerang Hu, San Jose, CA (US); Zhongwei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/925,606

(22) Filed: Mar. 19, 2018

(65) Prior Publication Data

US 2018/0350555 A1 Dec. 6, 2018

Related U.S. Application Data

(63) Continuation of application No. 15/213,781, filed on Jul. 19, 2016, now Pat. No. 9,922,799.

(Continued)

(51) Int. Cl.
*H01J 37/28* (2006.01)
*H01J 37/10* (2006.01)
(Continued)

(52) U.S. Cl.
CPC .............. *H01J 37/28* (2013.01); *H01J 37/10* (2013.01); *H01J 37/20* (2013.01); *H01J 37/244* (2013.01);
(Continued)

(58) Field of Classification Search
CPC .......... H01J 37/10; H01J 37/20; H01J 37/244; H01J 37/28; H01J 2237/0453;
(Continued)

(56) References Cited

U.S. PATENT DOCUMENTS 4,070,597 A * 1/1978 Hughes ................... H01J 29/76
313/431
4,740,698 A * 4/1988 Tamura ................... H01J 37/28
250/309

(Continued)

OTHER PUBLICATIONS

Ren et al., "US Patent Application", U.S. Appl. No. 15/065,342, filed Mar. 9, 2016.

*Primary Examiner* — David E Smith
(74) *Attorney, Agent, or Firm* — Finnegan, Henderson, Farabow, Garrett & Dunner, LLP

(57) ABSTRACT

A multi-beam apparatus for observing a sample with high resolution and high throughput and in flexibly varying observing conditions is proposed. The apparatus uses a movable collimating lens to flexibly vary the currents of the plural probe spots without influencing the intervals thereof, a new source-conversion unit to form the plural images of the single electron source and compensate off-axis aberrations of the plural probe spots with respect to observing conditions, and a pre-beamlet-forming means to reduce the strong Coulomb effect due to the primary-electron beam.

9 Claims, 14 Drawing Sheets

Related U.S. Application Data

(60) Provisional application No. 62/194,925, filed on Jul. 21, 2015.

(51) Int. Cl.
*H01J 37/20* (2006.01)
*H01J 37/244* (2006.01)

(52) U.S. Cl.
CPC .......... *H01J 2237/0453* (2013.01); *H01J 2237/0492* (2013.01); *H01J 2237/04924* (2013.01); *H01J 2237/04926* (2013.01); *H01J 2237/04928* (2013.01); *H01J 2237/1205* (2013.01); *H01J 2237/1501* (2013.01); *H01J 2237/1502* (2013.01); *H01J 2237/2446* (2013.01); *H01J 2237/2448* (2013.01); *H01J 2237/2806* (2013.01); *H01J 2237/2817* (2013.01)

(58) Field of Classification Search
CPC ..... H01J 2237/0492; H01J 2237/04924; H01J 2237/04926; H01J 2237/04928; H01J 2237/1205; H01J 2237/1501; H01J 2237/1502; H01J 2237/2446; H01J 2237/2448; H01J 2237/2806; H01J 2237/2817

See application file for complete search history.

(56) References Cited

U.S. PATENT DOCUMENTS

| | | |
|---|---|---|
| 7,244,949 B2 | 7/2007 | Knippelmeyer et al. |
| 7,880,143 B2 | 2/2011 | Tanimoto et al. |
| 8,129,693 B2 | 3/2012 | Preikszas |
| 9,082,577 B1 | 7/2015 | Fujita |
| 9,922,799 B2* | 3/2018 | Li .............. H01J 37/28 |
| 2003/0168606 A1 | 9/2003 | Adamec et al. |
| 2006/0169910 A1* | 8/2006 | Frosien ............ B82Y 10/00 250/396 ML |
| 2010/0224781 A1* | 9/2010 | Hosokawa ........... H01J 37/023 250/311 |
| 2013/0187046 A1* | 7/2013 | Zeidler ............. B82Y 10/00 250/310 |
| 2013/0299697 A1* | 11/2013 | Enyama ............ H01J 37/12 250/307 |

\* cited by examiner

APPARATUS OF PLURAL CHARGED-PARTICLE BEAMS

CLAIM OF PRIORITY

This application is a continuation of application Ser. No. 15/213,781, filed Jul. 19, 2019, (U.S. Pat. No. 9,922,799), which claims the benefit of priority of U.S. provisional application No. 62/194,925 entitled to Li et al. filed Jul. 21, 2015 and entitled "Apparatus of Plural Charged-Particle Beams". The disclosures of the above-referenced applications are incorporated herein by reference in their entireties.

BACKGROUND OF THE INVENTION

1. Field of the Invention

The present invention relates to a charged-particle apparatus with a plurality of charged-particle beams. More particularly, it relates to an apparatus which employs plural charged-particle beams to simultaneously acquire images of plural scanned regions of an observed area on a sample surface. Hence, the apparatus can be used to inspect and/or review defects on wafers/masks with high resolution and high throughput in semiconductor manufacturing industry.

2. Description of the Prior Art

For manufacturing semiconductor IC chips, pattern defects and/or uninvited particles (residuals) inevitably appear on a wafer and/or a mask during fabrication processes, which reduce the yield to a great degree. To meet the more and more advanced requirements on performance of IC chips, the patterns with smaller and smaller critical feature dimensions have been adopted. Accordingly, the conventional yield management tools with optical beam gradually become incompetent due to diffraction effect, and yield management tools with electron beam are more and more employed. Compared to a photon beam, an electron beam has a shorter wavelength and thereby possibly offering superior spatial resolution. Currently, the yield management tools with electron beam employ the principle of scanning electron microscope (SEM) with a single electron beam, which therefore can provide higher resolution but can not provide throughputs competent for mass production. Although a higher and higher current of the single electron beam can be used to increase the throughputs, the superior spatial resolutions will be fundamentally deteriorated by the Coulomb Effect which increases with the beam current.

For mitigating the limitation on throughput, instead of using a single electron beam with a large current, a promising solution is to use a plurality of electron beams each with a small current. The plurality of electron beams forms a plurality of probe spots on one being-inspected or observed surface of a sample. The plurality of probe spots can respectively and simultaneously scan a plurality of small scanned regions within a large observed area on the sample surface. The electrons of each probe spot generate secondary electrons from the sample surface where they land on. The secondary electrons comprise slow secondary electrons (energies ≤50 eV) and backscattered electrons (energies close to landing energies of the electrons). The secondary electrons from the plurality of small scanned regions can be respectively and simultaneously collected by a plurality of electron detectors. Consequently, the image of the large observed area including all of the small scanned regions can be obtained much faster than that scanned with a single beam.

The plurality of electron beams can be either from a plurality of electron sources respectively, or from a single electron source. For the former, the plurality of electron beams is usually focused onto and scans the plurality of small scanned regions within a plurality of columns respectively, and the secondary electrons from each scanned region are detected by one electron detector inside the corresponding column. Therefore, the currents or even landing energies of the plural electron beams can be varied individually.

For the latter, a source-conversion unit is used to virtually change the single electron source into a plurality of sub-sources. The source-conversion unit comprises one beamlet-forming means and one image-forming means. The beamlet-forming means basically comprises a plurality of beam-limit openings, which divides the primary-electron beam generated by the single electron source into a plurality of sub-beams or beamlets respectively. The image-forming means basically comprises a plurality of electron optics elements. If each electron optics element is a round lens, as described in U.S. Pat. No. 7,244,949 and shown in FIG. 1A, the plurality of beamlets will be focused to form a plurality of parallel real images of the single electron source respectively. If each electron optics element is a deflector, as described in U.S. patent application Ser. No. 15/065,342, the plurality of beamlets will be deflected to form a plurality of parallel virtual images of the single electron source respectively. Each of the plurality of parallel images can be taken as one sub-source which emits one corresponding beamlet. The beamlet intervals, i.e. the beam-limit opening intervals are at micro meter level so as to make more beamlets available, and hence the source-conversion unit can be made by semiconductor manufacturing process or MEMS (Micro Electro Mechanical Systems) process. In comparison with an electron optics element with conventional sizes, each corresponding lens and deflector are respectively called as micro-lens and micro-deflector or micro-multipole-lens.

In FIG. 1A, three beam-limit openings 21_1, 21_2 and 21_3 of the beamlet-forming means 21 divide one parallel primary-electron beam 2 coming from the single electron source (not shown here) into three beamlets 2_1, 2_2 and 2_3, and three micro-lenses 22_1, 22_2 and 22_3 of the image-forming means 22 respectively focus the beamlets 2_1~2_3 and form three parallel images 2_1r, 2_2r and 2_3r of the single electron source. The three parallel images are typically real. FIG. 1B and FIG. 1C show one embodiment of the image-forming means 22, which comprises three electric-conduction plates 22-e1, 22-e2 and 22-e3. The upper plate 22-e1 and the lower plate 22-e3 respectively have an upper and a lower large through-round hole and the middle plate 22-e2 has three middle small through-round holes H1, H2 and H3. When the potentials of the three plates are set to form different electrostatic fields above and below the middle plate, each of three middle small through-round holes H1, H2 and H3 will become an aperture lens. In another case (not shown here), the upper plate 22-e1 and the lower plate 22-e3 can respectively have three upper and lower small through-round holes correspondingly aligned with the three middle small through-round holes H1, H2 and H3. When the potentials of the three plates are set to form electrostatic fields therebetween, a round-lens field will be generated along the center axis (such as 22_2_0 of H2) of each of three through-round holes H1, H2 and H3, i.e. three traditional electrostatic lenses with three electrodes are formed.

Naturally, one primary projection imaging system and one deflection scanning unit within one single column are used to project the plurality of parallel images onto and scan the plurality of small scanned regions respectively, and the plurality of secondary electron beams therefrom is focused by one secondary projection imaging system to be respectively detected by a plurality of detection elements of one electron detection device inside the single column. The plurality of detection elements can be a plurality of electron detectors placed side by side or a plurality of pixels of one electron detector. The apparatus therefore is generally called as a multi-beam apparatus. FIG. 2A shows such a multi-beam apparatus 100A with one source-conversion unit shown in FIG. 1A. For sake of simplification, the primary projection imaging system 100A-P is simplified, and the secondary projection imaging system and the electron detection device are not displayed.

In FIG. 2A, the electron source 101 generates a primary-electron beam 102 with a source crossover (virtual or real) 101s, and the collimating lens 110 collimates the primary-electron beam 102 to be a parallel beam and incident onto the source-conversion unit 120. In the source-conversion unit 120, three beam-limit openings (121_1, 121_2 and 121_3) of the beamlet-forming means 121 divide the parallel primary-electron beam 102 into three beamlets (102_1, 102_2 and 102_3), and three micro-lenses (122_1, 122_2 and 122_3) of the image-forming means 122 respectively focus the three beamlets to form three real images (102_1r, 102_2r and 102_3r) of the source crossover 101s. To image the three real images onto the being-observed surface 7 of a sample 8 with small aberrations and therefore form three probe spots (102_1s, 102_2s and 102_3s) thereon, the primary projection imaging system 100A-P basically comprises one transfer lens and one objective lens. To reduce off-axis aberrations, the transfer lens can be placed to function as a field lens (U.S. Pat. No. 7,244,949) or form the telecentric path on the sample side of the objective lens (U.S. Pat. No. 7,880,143).

Two key issues limit the available performance and application conditions (currents and landing energies of the plural beamlets) of this multi-beam apparatus as one yield management tool. The first one is the difficulty of changing currents of the plural beamlets or the probe spots, and the second one is the non-uniformity of sizes of the plural probe spots due to off-axis aberrations generated by the collimating lens and the primary projection imaging system. Some samples require specific currents of the plural beamlets due to charging-up, and the first issue may make observing such samples impossible. Due to the second issue, the differences of the image resolutions of the plural small scanned regions may increase detection errors of some defects.

As shown in FIG. 2B, obviously, the current of the plural beamlets can not be changed by varying the focusing power of the collimating lens no. If the focusing power is weakened or strengthened, the primary-electron beam 102 will become divergent or convergent accordingly. In these cases, the off-axis beamlets 102_2 and 102_3 (not along the optical axis 110_1 of the collimating lens 110) will be not parallel to the optical axes 122_2_1 and 122_3_1 of the corresponding micro-lenses 122_2 and 122_3. Accordingly, the corresponding images 102_2r and 102_3r will have radial shifts ΔP2 and ΔP3 with respect to the optical axes 122_2_1 and 122_3_. The radial shifts ΔP2 and ΔP3 depend on the off-axis distances P2 and P3 respectively, and consequently incur non-uniform pitch variations of the plural probe spots on the sample surface 7. This will generate undesired gaps or overlays between adjacent scanned regions, and therefore reduce the throughput and deteriorate of the resolutions due to additional cross-talks of the images thereof.

Certainly, the current of the plural beamlets can be changed by varying either the emission of the single electron source or the sizes of the beam-limit openings (U.S. 2013/0,187,046). The single electron source takes a long time to become stable when the emission thereof is varied. To change the sizes of the beam-limit openings, the beamlet-forming means needs to have more beam-limit openings with different sizes. It is very time-consuming for moving and aligning the beam-limit openings with desired sizes.

Regarding the second issue, the off-axis aberrations will change with respect to the operation conditions of the primary projection imaging system. As well known, the landing energies of the plurality of probe spots and/or electrostatic field on the sample surface 7 are usually chosen according to the features (such as material and pattern sizes) thereof, hence the operation conditions need to be adjusted correspondingly. Among the off-axis aberrations, as proposed by U.S. Pat. No. 7,244,949, by specifically arranging the size differences, shape differences and position differences of the micro-lenses (122_1, 122_2 and 122_3 in FIG. 2A), the field curvature aberrations, the astigmatism aberrations and the distortions can be compensated. However, these size differences, shape differences and position differences can compensate the off-axis aberrations for certain landing energies but may be not competent for some others. Therefore the acceptable range of landing energies and the number of beamlets may be limited.

Accordingly, it is necessary to provide a multi-beam apparatus which can simultaneously obtain images of a plurality of small scanned regions within a large observed area on the sample surface with high image resolution and high throughput in variable application. The multi-beam apparatus is especially needed to match the roadmap of the semiconductor manufacturing industry.

SUMMARY OF THE INVENTION

The object of this invention is to provide a new multi-beam apparatus which provide both high resolution and high throughput for observing a sample in flexibly varying observing conditions (such as currents and landing energies of the probe spots, electrostatic field on the sample surface). The apparatus can function as a yield management tool to inspect and/or review defects on wafers/masks in semiconductor manufacturing industry. At first, the new multi-beam apparatus uses a movable collimating lens to vary the currents of the plurality of probe spots without incurring pitch variations thereof. Secondly, the new multi-beam apparatus employs a new source-conversion unit to form the plurality of parallel real images of the single electron source and compensate off-axis aberrations of the plurality of probe spots with respect to the currents and the landing energies thereof. Furthermore, a pre-beamlet-forming means is placed close to the single electron source to reduce the strong Coulomb effect due to the primary-electron beam as soon as possible.

Accordingly, the invention therefore provides a multi-beam apparatus, which comprises an electron source, a movable collimating lens below the electron source, a source-conversion unit below the movable collimating lens, a primary projection imaging system below the source-conversion unit, a deflection scanning unit below the source-conversion unit, a sample stage below the primary projection imaging system, a beam separator below the source-conversion unit, a secondary projection imaging system above the beam separator, and an electron detection device with a plurality of detection elements. The electron source, movable collimating lens and source-conversion unit are aligned with a primary optical axis of the apparatus, and the sample stage sustains the sample so that the surface faces to the primary projection imaging system. A first principal plane of that movable collimating lens can be moved along the primary optical axis, and the source-conversion unit comprises a beamlet-forming means with a plurality of beam-limit openings and an image-forming means with a plurality of electron optics elements. The electron source generates a primary-electron beam along the primary optical axis, and the movable collimating lens collimates the primary-electron beam into the source-conversion unit. A plurality of beamlets of the primary-electron beam respectively passes through the plurality of beam-limit openings and is focused to form a plurality of parallel images of the electron source by the plurality of electron optics elements respectively, and the plurality of beam-limit openings limits currents of said plurality of beamlets. The primary projection imaging system projects the plurality of parallel images onto that surface and therefore the plurality of beamlets forms a plurality of probe spots thereon, and the deflection scanning unit deflects the plurality of beamlets to scan the plurality of probe spots respectively over a plurality of scanned regions within an observed area on the surface. A plurality of secondary electron beams is generated by the plurality of probe spots respectively from the plurality of scanned regions and directed into the secondary projection imaging system by the beam separator, which then focuses and keeps the plurality of secondary electron beams to be detected by the plurality of detection elements respectively, and each detection element therefore provides an image signal of one corresponding scanned region. When the first principal plane is moved from one place to another place along the primary optical axis, a current density of the collimated primary-electron beam changes accordingly and consequently the currents of said plurality of beamlets vary.

The movable collimating lens, in one embodiment, may comprise multiple annular electrodes which are placed at different axial positions along and aligned with the primary optical axis, and voltages thereof can be adjusted to move that first principal plane so as to vary the currents of the plurality of beamlets.

The movable collimating lens, in one embodiment, may comprise at least two single magnetic lenses which are placed at different axial positions along and aligned with the primary optical axis, and excitations thereof can be adjusted to move that first principal plane so as to vary the currents of the plurality of beamlets.

The movable collimation lens, in one embodiment, may comprise multiple annular electrodes and at least one magnetic lens which are placed at different axial positions along and aligned with the primary optical axis, and voltages of the electrodes and excitations of that at least one magnetic lens can be adjusted to move that first principal plane for varying the currents of the plurality of beamlets.

Each of the plurality of electron optics elements may comprise one or more micro-multipole-lenses which compensate off-axis aberrations of one corresponding probe spot. The multi-beam apparatus, in one embodiment, may further comprise a pre-beamlet-forming means for reducing Coulomb effect, which is close to the electron source and has a plurality of beamlet-forming apertures, wherein each of that plurality of beamlets passes through one of the plurality of beamlet-forming apertures and therefore the plurality of beamlet-forming apertures cut off most of those electrons which do not constitute the plurality of beamlets.

The present invention also provides another multi-beam apparatus, which comprises an electron source, a collimating lens below the electron source, a source-conversion unit below the collimating lens, a primary projection imaging system below the source-conversion unit, a deflection scanning unit below the source-conversion unit, a sample stage below the primary projection imaging system, a secondary projection imaging system above the beam separator, and an electron detection device with a plurality of detection elements. The electron source, collimating lens and source-conversion unit are aligned with a primary optical axis of that apparatus, and the sample stage sustains the sample so that the surface faces to the primary projection imaging system. The source-conversion unit comprises a beamlet-forming means with a plurality of beam-limit openings and an image-forming means with a plurality of electron optics elements each having a micro-mutlipole-lens. The electron source generates a primary-electron beam along the primary optical axis, and the collimating lens collimates the primary-electron beam into the source-conversion unit. A plurality of beamlets of that primary-electron beam respectively passes through the plurality of beam-limit openings and is focused to form a plurality of parallel images of the electron source by the plurality of electron optics elements respectively, and the plurality of beam-limit openings limits currents of said plurality of beamlets. The primary projection imaging system projects the plurality of parallel images onto the surface and therefore the plurality of beamlets forms a plurality of probe spots thereon. The micro-multipole-lens of each electron optics element compensates off-axis aberrations of one corresponding probe spot, and the deflection scanning unit deflects the plurality of beamlets to scan the plurality of probe spots respectively over a plurality of scanned regions within an observed area on the surface. A plurality of secondary electron beams is generated by the plurality of probe spots respectively from the plurality of scanned regions and directed into the secondary projection imaging system by the beam separator, which then focuses and keeps the plurality of secondary electron beams to be detected by the plurality of detection elements respectively, and each detection element therefore provides an image signal of one corresponding scanned region.

The multi-beam apparatus, in one embodiment, may further comprises a pre-beamlet-forming means for reducing Coulomb effect, which is close to the electron source and has a plurality of beamlet-forming apertures, wherein each of the plurality of beamlets passes through one of the plurality of beamlet-forming apertures and therefore the plurality of beamlet-forming apertures cut off most of those electrons which do not constitute the plurality of beamlets.

The present invention also provides a method to change currents of a plurality of beamlets in a multi-beam apparatus for observing a surface of a sample, which comprises steps of collimating a primary-electron beam of the apparatus by a movable collimating lens, and changing a current density of the collimated primary-electron beam by moving a first principal plane of the collimating lens along a primary optical axis of said apparatus.

The movable collimating lens, in one embodiment, may comprise at least two single magnetic lenses, and the first principal plane is moved by adjusting excitations thereof. The movable collimating lens, in another embodiment, may comprise multiple annular electrodes, and the first principal plane is moved by adjusting voltages thereof. The movable collimating lens, in still another embodiment, may comprise multiple annular electrodes and at least one single magnetic lens, and the first principal plane is moved by adjusting voltages of the multiple annular electrodes and excitations of that at least one single magnetic lens.

The present invention also provides a method to configure a source-conversion unit in a multi-beam apparatus for observing a surface of a sample, which comprises steps of providing a beamlet-forming means with a plurality of beam-limit openings, providing an image-forming means with a plurality of electron optics elements, providing one or more micro-multipole-lenses in each of the plurality of electron optics elements, and enabling that one or more micro-multipole-lenses to generate a round-lens field, a dipole field and a quadrupole field for compensating field curvature, distortion and astigmatism of one corresponding probe spot of the apparatus.

The present invention also provides a method to reduce Coulomb effect in a multi-beam apparatus for observing a surface of a sample, which comprises steps of placing a pre-beamlet-forming means between an electron source and a source-conversion unit of said apparatus. The pre-beamlet-forming means has a plurality of beamlet-forming apertures which divide a primary-electron beam of the electron source into a plurality of beamlets. A plurality of beam-limit openings of the source-conversion unit limits currents of the plurality of beamlets.

The present invention also provides a device for providing multiple sources, which comprises a charged-particle source for providing a primary beam along an optical axis of the device, means for imaging a plurality of parallel images of the charged-particle source with a plurality of beamlets of the primary beam, and means for selecting currents of the plurality of beamlets with positions of the plurality of parallel images being remained, between the charged-particle source and the imaging means. The plurality of parallel images becomes the multiple sources which emit the plurality of beamlets respectively.

The device, in one embodiment, may further comprise means for suppressing Coulomb effect due to the primary beam.

The present invention also provides a multi-beam apparatus, which comprises the device for providing the multiple sources, means for projecting the multiple sources onto a sample surface and forming a plurality of probe spots thereon, means for scanning the plurality of probe spots on the sample surface, and means for receiving a plurality of signal particle beams coming from the plurality of probe spots.

The present invention also provides a device for providing multiple sources, which comprises a charged-particle source for providing a primary beam along an optical axis of the device, a lens for condensing the primary beam along the optical axis, a plate including a plurality of openings for trimming the primary beam into a plurality of beamlets, and a plurality of micro-multipole-lens for respectively focusing the plurality of beamlets to form a plurality of images of the charged-particle source, and providing a plurality of dipole fields and quadrupole fields individually, wherein the plurality of images becomes the multiple sources which emit the plurality of beamlets respectively. The plurality of dipole fields, in the embodiment, can preserve or keep positions of the plurality of images or sources.

The lens is movable along the optical axis for selecting currents of the plurality of beamlets. The device, in one embodiment, may further comprise means for suppressing Coulomb effect due to the primary beam.

The present invention also provides a multi-beam apparatus, which comprises the device for providing the multiple sources, means for imaging the multiple sources onto a sample surface to form a plurality of probe spots, means for scanning the plurality of probe spots, and means for receiving a plurality of signal particle beams from the plurality of probe spots.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF EXAMPLE EMBODIMENTS

Figure 1A:
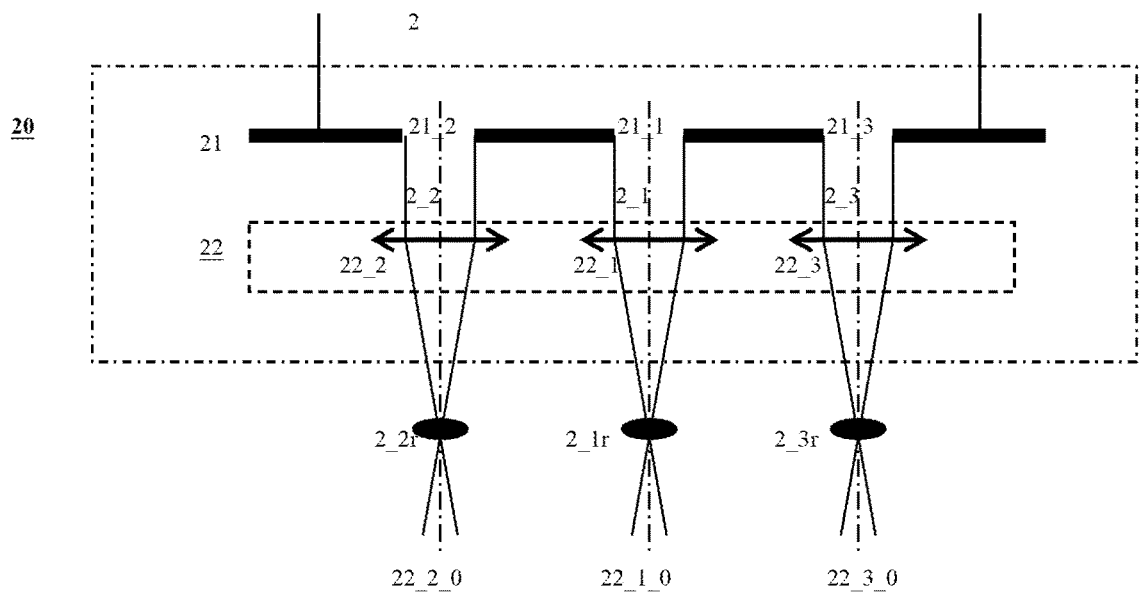
FIG. 1A is a schematic illustration of a conventional source-conversion unit.
Figure 1B:
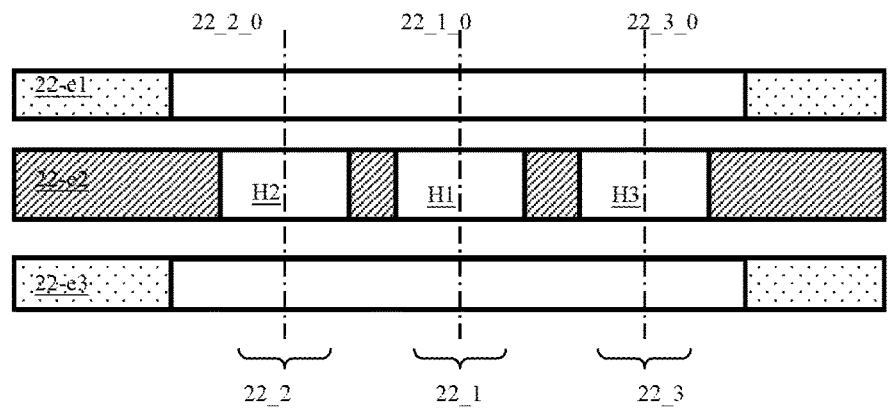
FIG. 1B and FIG. 1C are schematic illustrations of a conventional image-forming means or micro-lens array.
Figure 1C:
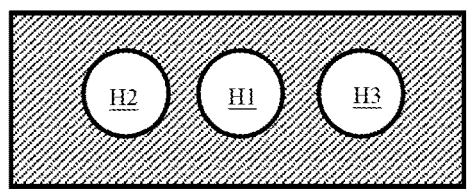

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of a lens or an apparatus", "radial" means "in a direction perpendicular to the optical axis", "on-axial" means "on or aligned with the optical axis", and "off-axis" means "not on or not aligned with the optical axis".

In this invention, X, Y and Z axe form Cartesian coordinate, the optical axis of an apparatus is on the Z-axis and a primary-electron beam travels along the Z-axis.

In this invention, all terms relate to through-holes, openings and orifices mean openings or holes penetrated through one plate.

In this invention, "primary electrons" means "electrons emitted from an electron source and incident onto a being-observed or inspected surface of a sample, and "secondary electrons" means "electrons generated from the surface by the "primary electrons".

Figure 2A:
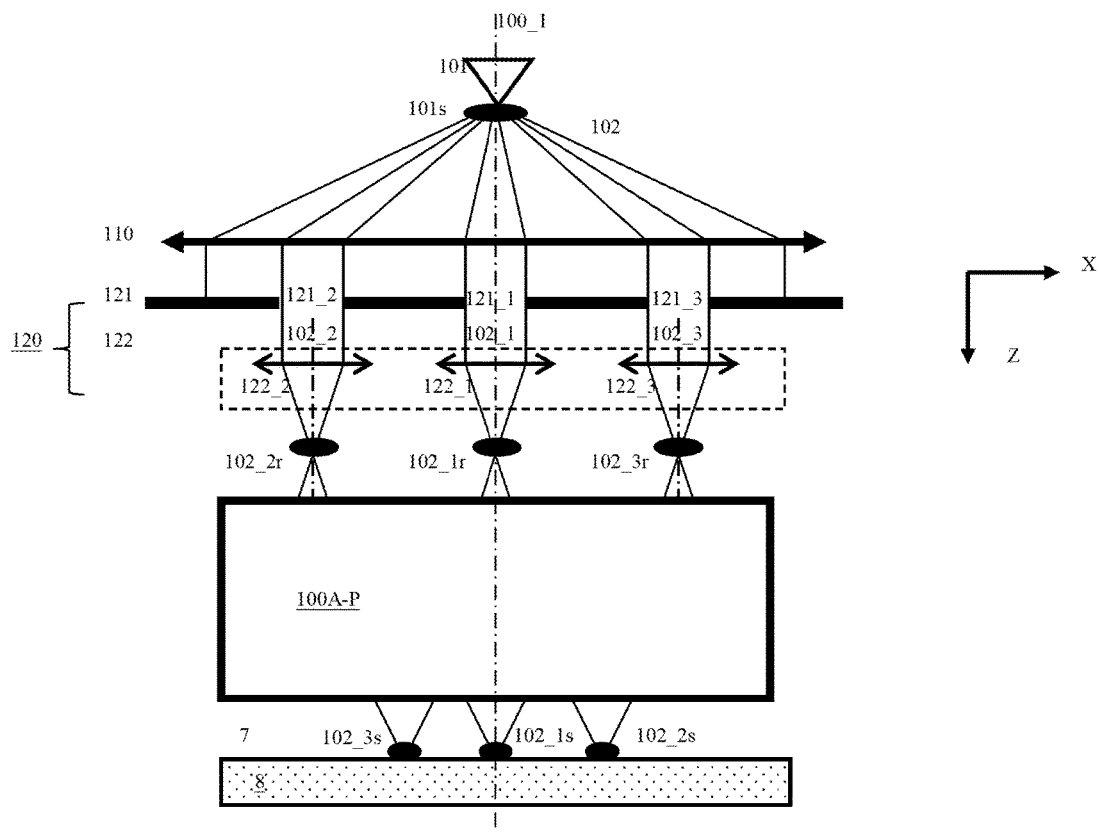
FIG. 2A and FIG. 2B are schematic illustrations of a conventional multi-beam apparatus.
Figure 2B:
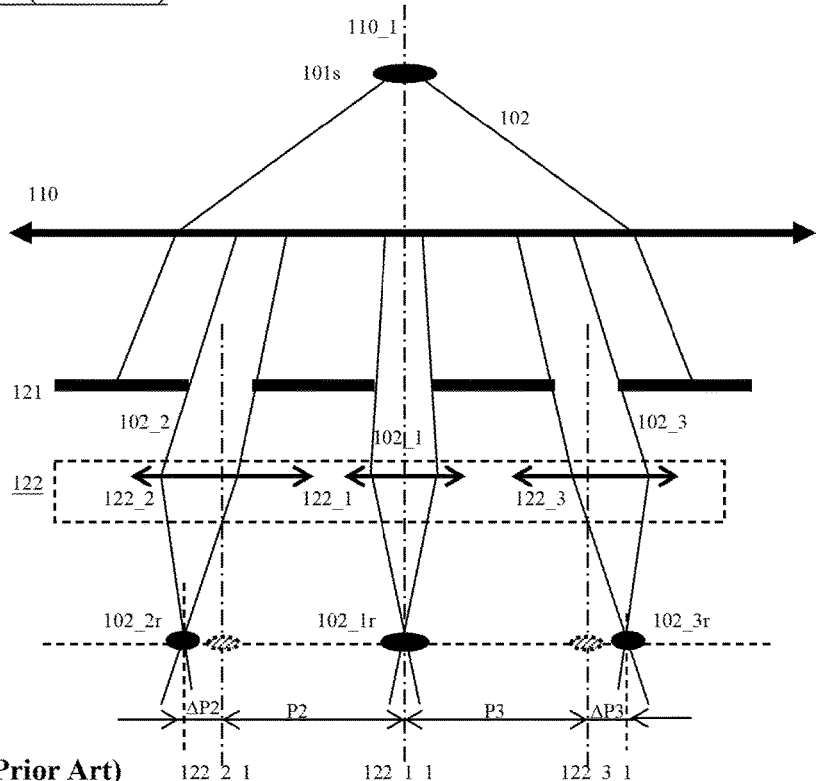

As described in "BACKGROUND OF THE INVENTION", as a yield management tool, one conventional multi-beam apparatus in FIG. 2A has two issues. The first one is the difficulty to flexibly and fast change currents of the plurality of probe spots, and the second one is the limitation on flexibly and fast compensating the uniformity variation of sizes of the plurality of probe spots when varying the landing energies thereof and/or the electrostatic field on the sample surface. The present invention proposes corresponding methods to solve the foregoing issues. The first method is to use a movable collimating lens to vary the currents of the plurality of beamlets without changing the positions of the plurality of parallel images. The second method is to use a micro-lens-and-compensator array as an image-forming means which not only forms the plurality of parallel images but also can be flexibly and fast adjusted to compensate the off-axis aberrations of the plurality of probe spots and thereby improving the uniformity variation thereof, or to add an aberration-compensation means or a micro-compensator array to the conventional source-conversion unit to flexibly compensate the off-axis aberrations. In addition, the present invention proposes the third method which uses a pre-beamlet-forming means to reduce the strong Coulomb effect in the area above the source-conversion unit. In this area, the current of the primary-electron beam is very large and the electrons not in use are better cut off as soon as possible.

Next some embodiments with the foregoing methods will be described. For sake of clarity, only three beamlets are shown, and the number of beamlets can be anyone. For sake of simplification, the details of the primary projection imaging system and the electron detection system are not shown or even not mentioned in the illustrations and the description of the embodiments respectively. The primary projection imaging systems and the electron detection systems in prior art can be used here.

Figure 3A:
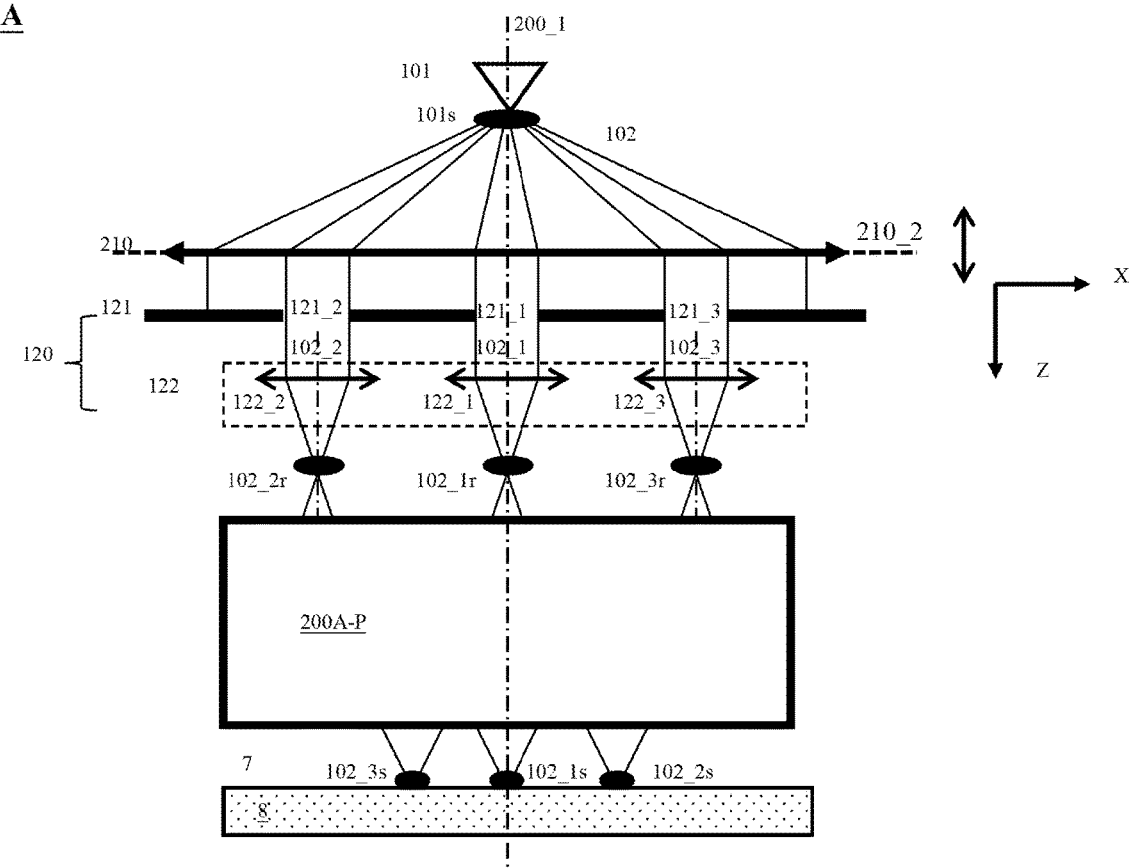
FIGS. 3A~3C are schematic illustrations of a new multi-beam apparatus in accordance with one embodiment of the present invention.

One embodiment 200A of a new multi-beam apparatus employing the first method is shown in FIG. 3A. In comparison with the prior art in FIG. 2A, it use a movable collimating lens 210. The first principal plane 210_2 of the movable collimating lens 210 is movable along the optical axis thereof, which is aligned with the primary optical axis 200_1 of the apparatus.

Same to the prior art, the electron source 101 generates a primary-electron beam 102 with a source crossover (virtual or real) 101s located on the primary optical axis 200_1, the primary-electron beam 102 is collimated to be parallel to the primary optical axis 200_1 and incident onto the source-conversion unit 120. In the source-conversion unit 120, the three beam-limit openings (121_1, 121_2 and 121_3) of the beamlet-forming means 121 divide the parallel or collimated primary-electron beam 102 into three beamlets (102_1, 102_2 and 102_3) and limit currents thereof. Then the three beamlets are incident onto the image-forming means 122 with three micro-lenses (122_1, 122_2 and 122_3). The three beamlets respectively enter the three micro-lenses along the optical axes thereof and accordingly form three images of the source crossover 101s thereon. Next, the primary projection imaging system 200A-P projects the three images onto the being-observed surface 7 of a sample 8 and thereby forming three probe spots (102_1s, 102_2s and 102_3s) thereon.

Figure 3B:
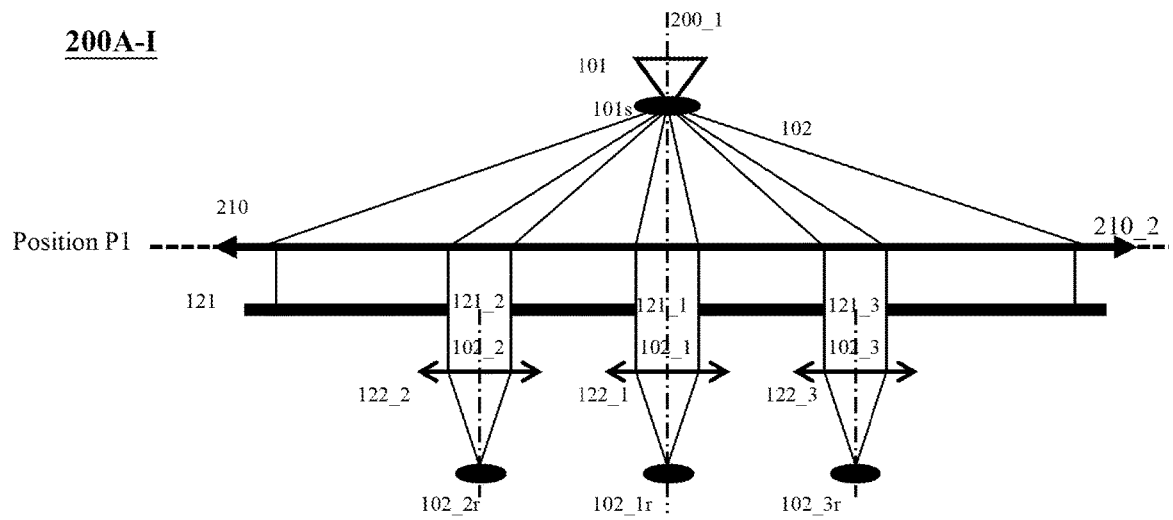
Figure 3C:
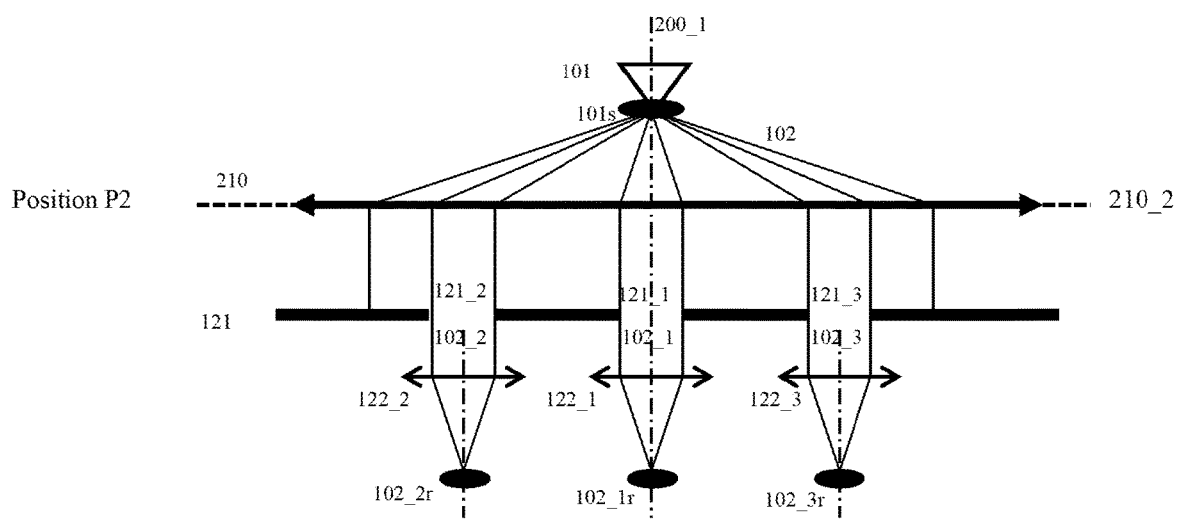

Different from the prior art, the collimation position of the primary-electron beam 102 or the first principal plane 210_2 of the movable collimating lens 210 can be moved along the primary optical axis 200_1, and the current density of the primary-electron beams 102 incident onto the beamlet-forming means 121 accordingly changes. Consequently, the currents of the three beamlets vary without adjusting the emission of the single electron source 101 and/or using other beam-limit openings with other sizes. In FIG. 3B and FIG. 3C, the first principal plane 210_2 is at the position 1 and position 2 respectively, and the position 2 is closer to the single electron source 101 than the position 1. Due to the primary-electron beam 102 is collimated earlier in FIG. 3C than in FIG. 3B, the current density thereof becomes higher in FIG. 3C than in FIG. 3B. Hence the closer to the single electron source 101 the first principal plane 210_2 is, the higher the currents of the three beamlets are, and vice versa.

Figure 4A:
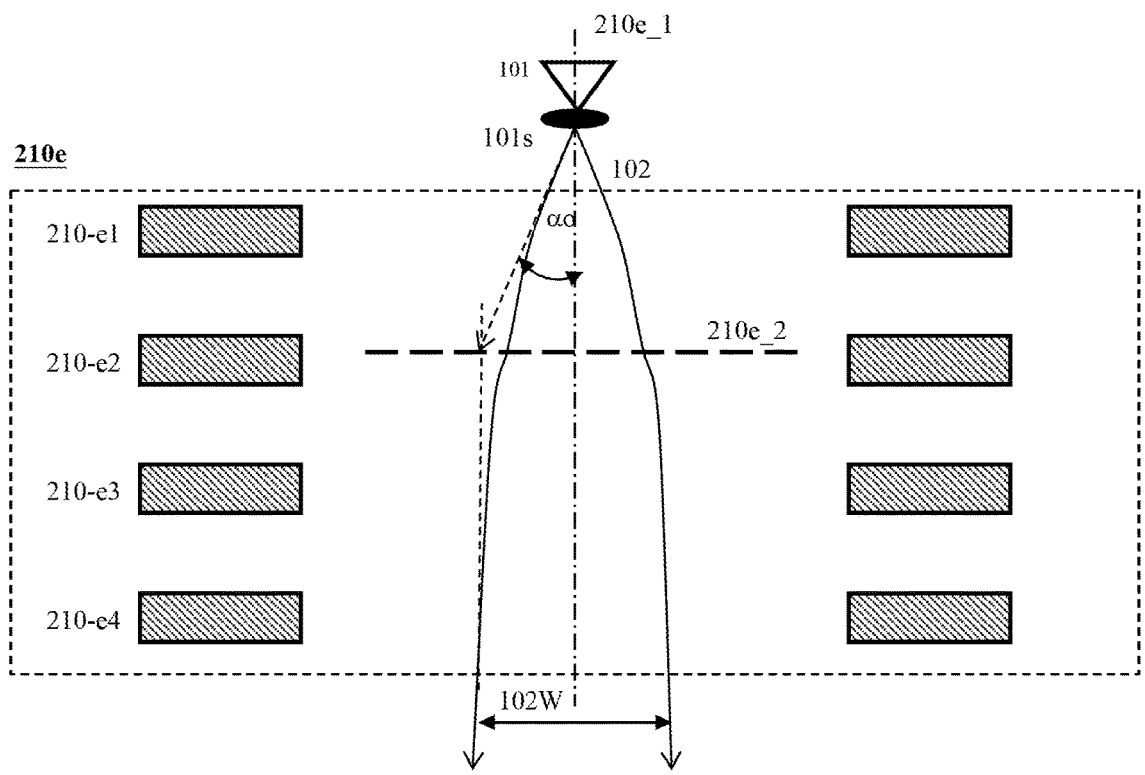
FIGS. 4A and 4B are schematic illustrations of one configuration of the movable collimating lens in FIG. 3A in accordance with another embodiment of the present invention.
Figure 4B:
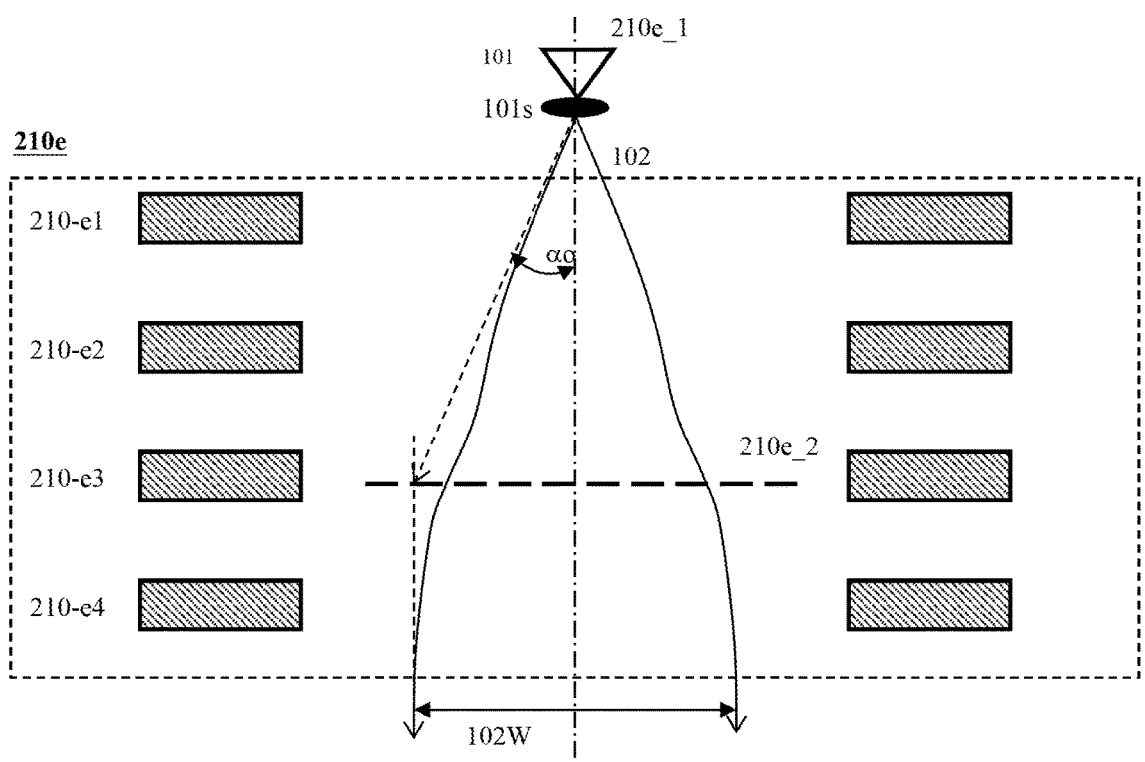

The displacement of the first principal plane 210_2 can be done by mechanically moving the position of the movable collimating lens 210 or electrically moving the position and/or changing the shape of the round-lens field thereof. The movable collimating lens 210 can be electrostatic, or magnetic, or electromagnetic compound. FIGS. 4A and 4B show one embodiment 210e of the movable collimating lens 210. The embodiment 210e with an optical axis 210e_1 is an electrostatic lens, which comprises four annular electrodes 210ee1, 210e-e2, 210e-e3 and 210e-e4 aligned with the optical axis 210e_1. The optical axis 210e_1 is placed coincident with the primary optical axis 200_1.

The focusing power and the position of the first principal plane 210e_2 of the embodiment 210e vary with the excitation mode of the annular electrodes 210e-e1~210e-e4. For example, in FIG. 4A, the potentials of the electrodes 210e-e1, 210e-e3 and 210e-e4 are same (which are equal to the potential on the exit side of the single electron source 101 here, but can be other values), but different from the potential of the electrode 210e-e2. In this case, the first principal plane 210e_2 is formed close to the electrode 210e-e2 and the primary-electron beam 102 can be collimated over there when the electrode 210e_e2 is set an appropriate potential. In FIG. 4B, the potentials of the electrodes 210e-e1, 210e-e2 and 210e-e4 are same (which are equal to the potential on the exit side of the single electron source 101 here, but can be other values), but different from the potential of the electrode 210e-e3. Accordingly, the first principal plane 210e_2 is formed close to the electrode 210e-e3, and the primary-electron beam 102 can be collimated over there when the electrode 210e-e3 is at an appropriate potential. After exiting the movable collimating lens 210e, the width 102W of the primary-electron beam 102 will be smaller in FIG. 4A than in FIG. 4B. In both cases the primary-electron beam 102 has a same current, and therefore has a higher current density in FIG. 4A than in FIG. 4B. Obviously, the first principal plane 210e_2 can be placed to another position in another excitation mode. Consequently, by appropriately setting the potentials of the four electrodes 210e-e1~210e-e4, the first principal plane 210e_2 can be flexibly moved along the optical axis 210e_1 within the embodiment 210e.

Figure 5A:
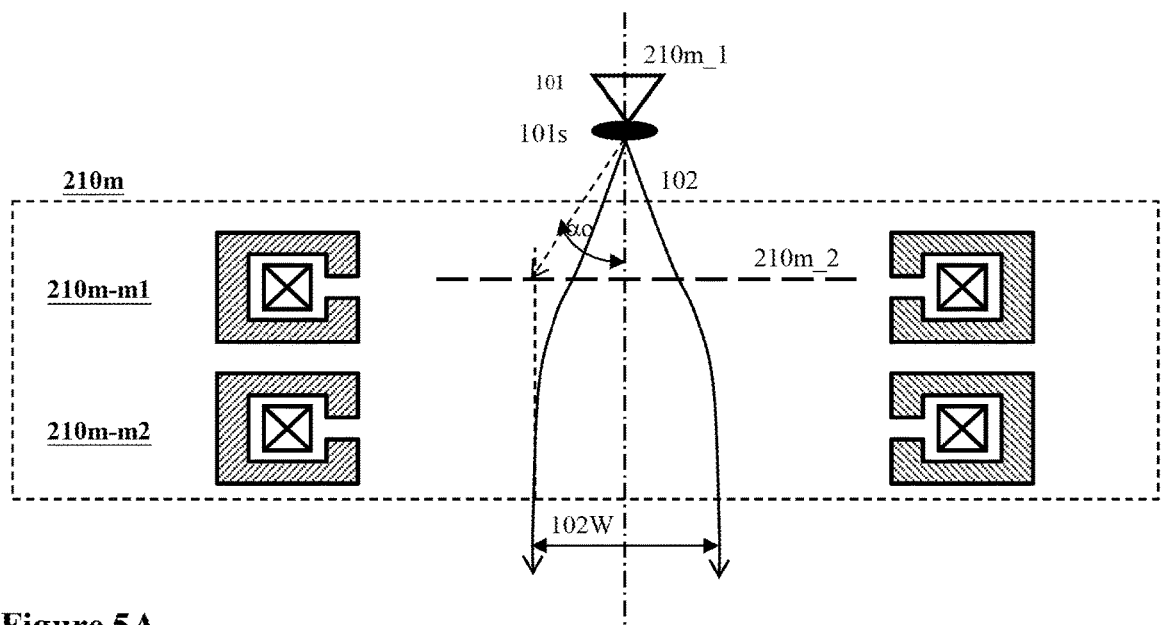
FIGS. 5A and 5B are schematic illustrations of another configuration of the movable collimating lens in FIG. 3A in accordance with another embodiment of the present invention.
Figure 5B:
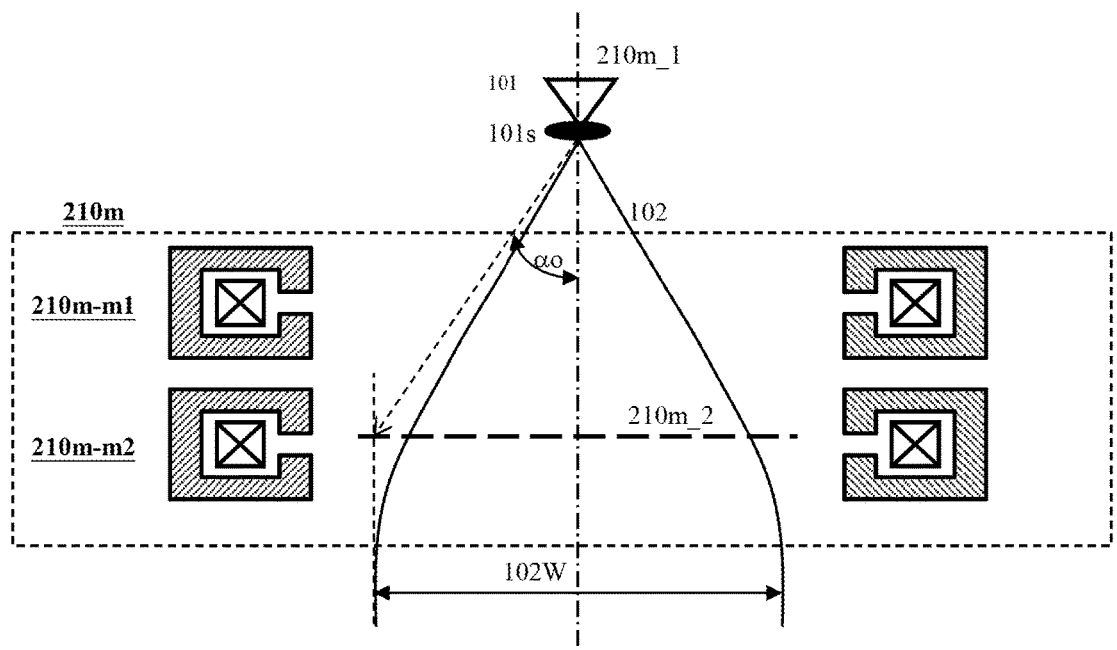

FIGS. 5A and 5B show another embodiment 210m of the movable collimating lens 210. The embodiment 210m with an optical axis 210m_1 is a compound magnetic lens, which comprises two single magnetic lenses 210m-m1 and 210m-m2 aligned with the optical axis 210m_1. The optical axis 210m_1 is placed coincident with the primary optical axis 200_1.

The focusing power and the position of the first principal plane 210m_2 of the embodiment 210m vary with the excitation mode of the single magnetic lenses 210m-m1 and 210m-m2. For example, in FIG. 5A, the excitation of the single magnetic lens 210m-m2 is set zero, and the excitation of the single magnetic lens 210m-m1 is set a non-zero value. Hence, the first principal plane 210m_2 is formed within the magnetic-circuit gap of the single magnetic lens 210m-m1 and the primary-electron beam 102 can be collimated over there by appropriately setting the excitation thereof. In FIG. 5B, the excitation of the single magnetic lens 210m-m1 is set zero and the excitation of the single magnetic lens 210m-m2 is set a non-zero value. In this case, the first principal plane 210m_2 is formed within the magnetic-circuit gap of the single magnetic lens 210m-m2 and the primary-electron beam 102 can be collimated over there by appropriately setting the excitation thereof. The first principal plane 210m_2 is closer to the single electron source 101 in FIG. 5A than in FIG. 5B. Therefore, after exiting the movable collimating lens 210m, the width 102W of the primary-electron beam 102 will be smaller in FIG. 5A than in FIG. 5B. In both cases the primary-electron beam 102 has a same current, and therefore has a higher current density in FIG. 5A than in FIG. 5B. Obviously, the first principal plane 210m_2 can be flexibly moved between the positions in FIG. 5A and FIG. 5B by changing the ratio of the excitations of the single magnetic lenses 210m-m1 and 210m-m2.

Figure 6A:
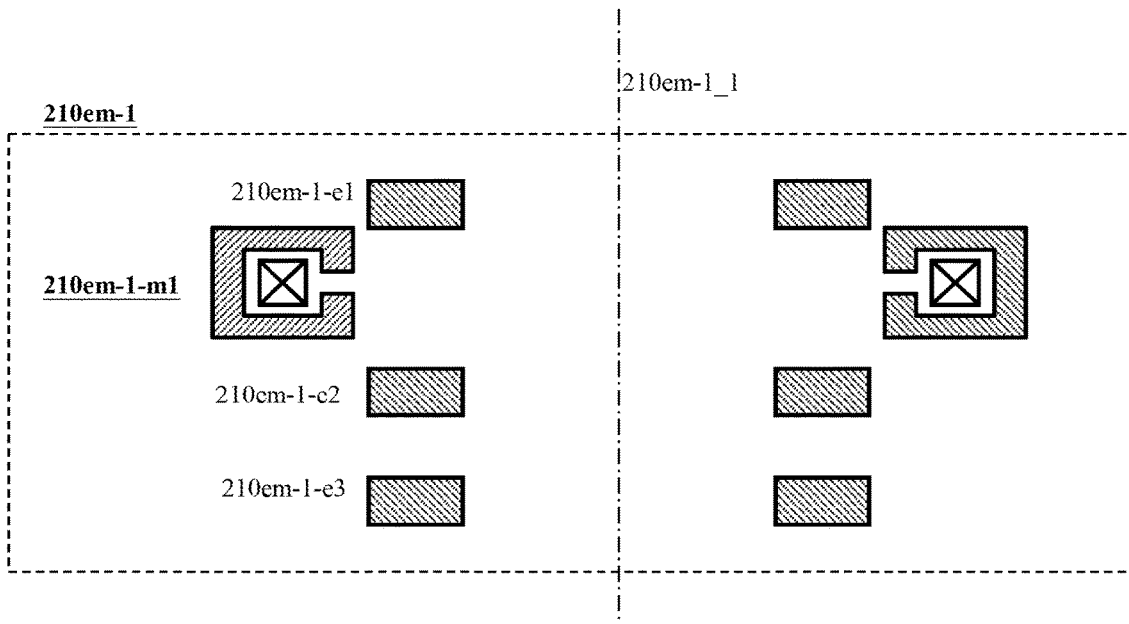
FIGS. 6A and 6B are respectively a schematic illustration of another configuration of the movable collimating lens in FIG. 3A in accordance with another embodiment of the present invention.
Figure 6B:
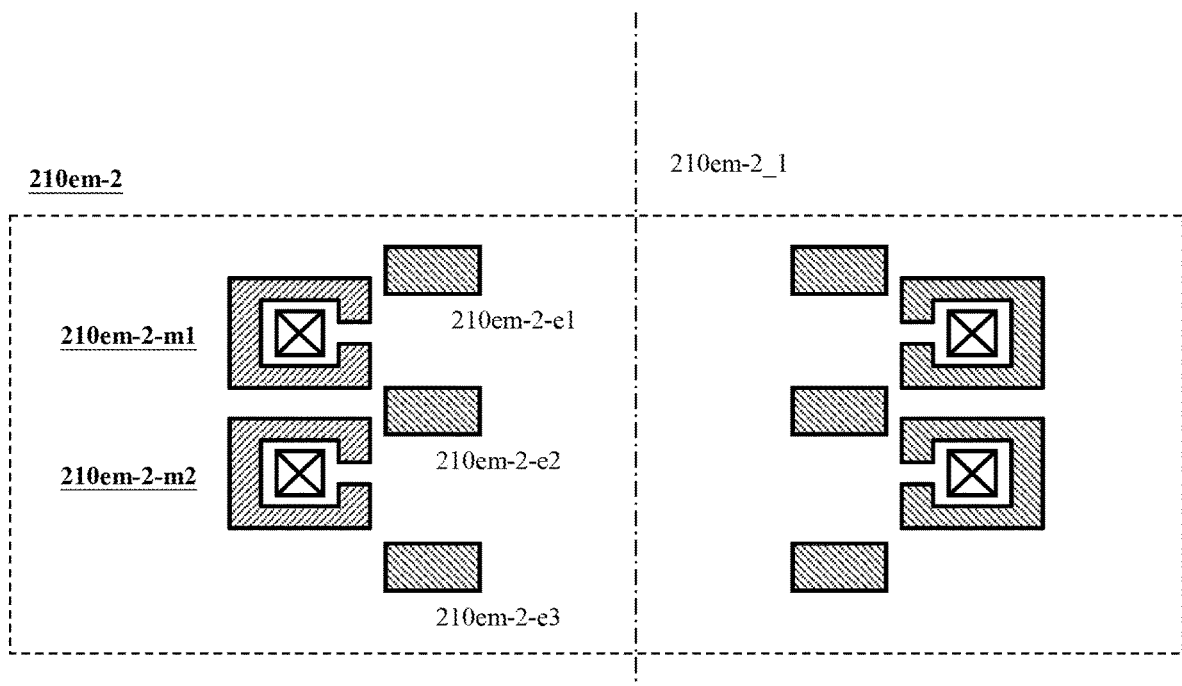

FIG. 6A shows another embodiment 210em-1 of the movable collimating lens 210. The embodiment 210em-1 with an optical axis 210em-1_1, is an electromagnetic compound lens comprising a single magnetic lens 210em-1-m1 and three annular electrodes 210em-1-e1, 210em-1-e2 and 210em-1-e3 all aligned with the optical axis 210em-1_1. The axial positions of the three annular electrodes and the magnetic-circuit gap of the single magnetic lens are different, therefore the focusing power and the position of the first principal plane of the embodiment 210em-1 can be changed by varying the potentials of the three annular electrodes and the excitation of the single magnetic lens. In another embodiment 210em-2 with the optical axis 210em-2_1 and shown in FIG. 6B, there are two single magnetic lenses 210em-2-m1 and 210em-2-m2 and three annular electrodes 210em-2-e1, 210em-2-e2 and 210em-2-e3 all aligned with the optical axis 210em-2_1 and with different axial positions. For this embodiment, the focusing power and the position of the first principal plane can be changed by varying the potentials of the three annular electrodes and the excitations of the two single magnetic lenses.

Figure 7:
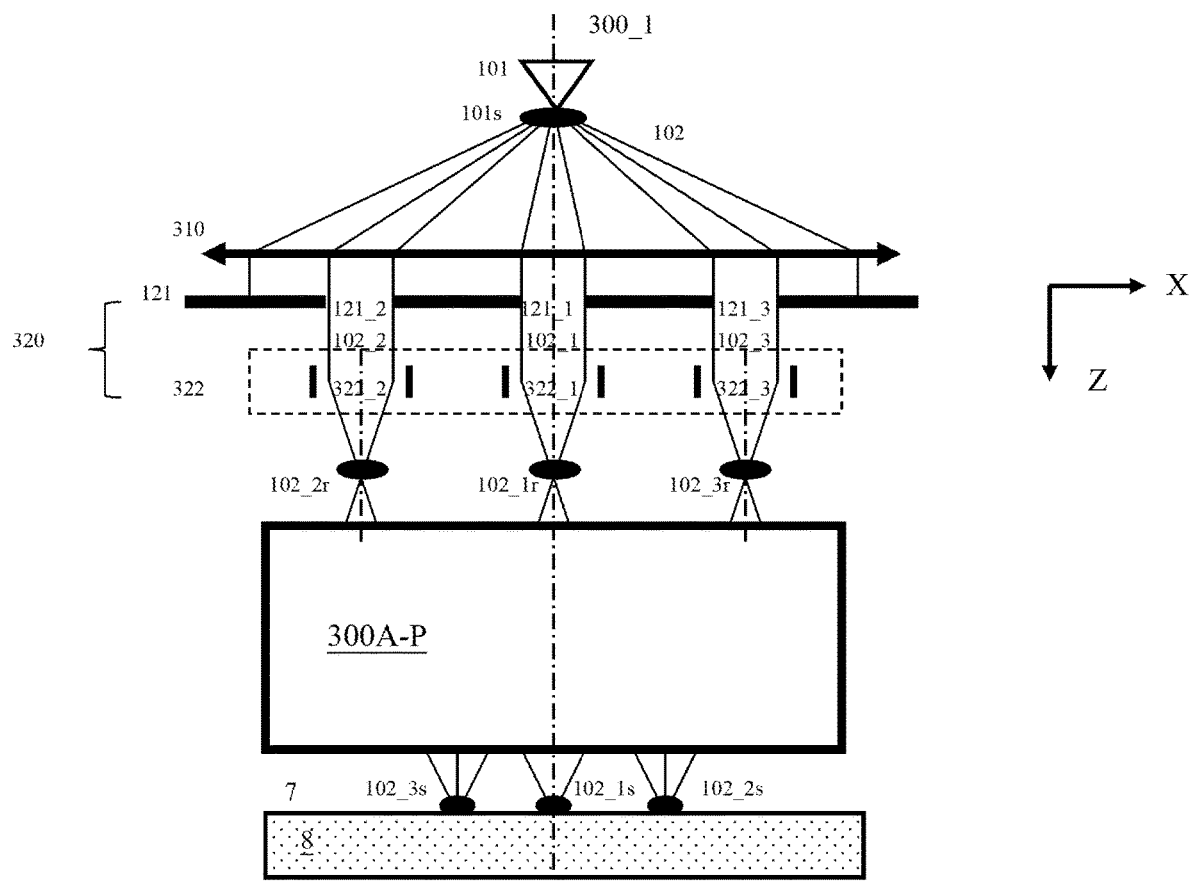
FIG. 7 is a schematic illustration of a new multi-beam apparatus in accordance with another embodiment of the present invention.

One embodiment 300A of another new multi-beam apparatus employing the second method is shown in FIG. 7. In comparison with the prior art in FIG. 2A, the image-forming means 322 in the source-conversion unit 320 is one micro-lens-and-compensator array with three micro-lens-and-compensator elements 322_1, 322_2 and 322_3. Each micro-lens-and-compensator element (322_1~322_3) is aligned with one of three beam-limit openings (121_1, 121_2 and 121_3) of the beamlet-forming means 121, functions as one micro-lens to form one image (102_1r, 102_2r and 102_3r) of the source crossover 101s and can additionally function as one micro-compensator to compensate the field curvature, astigmatism and distortion of the corresponding probe spot (102_1s, 102_2s and 102_3s). Hence each micro-lens-and-compensator element comprises a micro-multipole-lens which can generate a round-lens field for forming the image of the source crossover 101s and compensating the field curvature of the probe spot, a quadrupole field and a dipole field for respectively compensating the astigmatism and distortion of the probe spot.

Figure 8A:
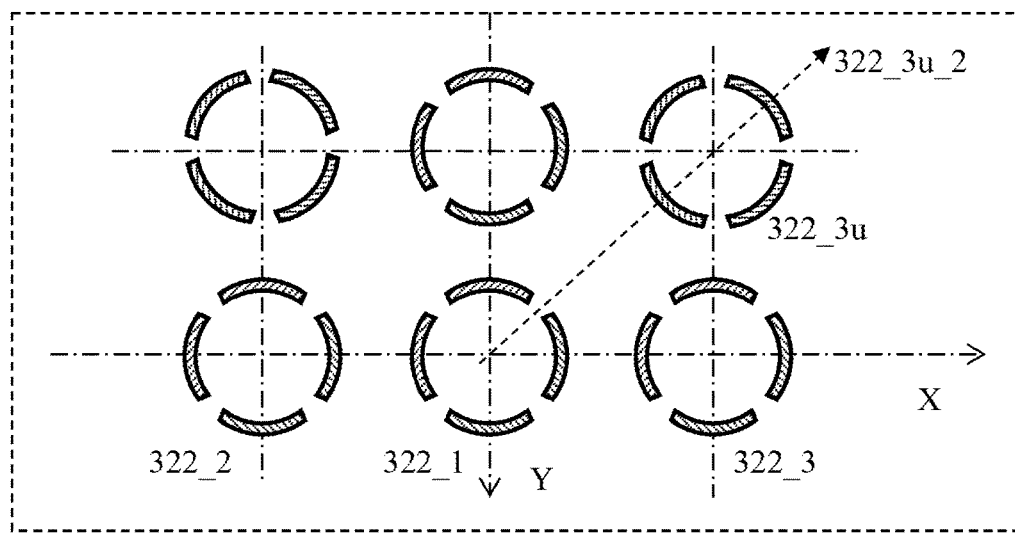
FIG. 8A and FIG. 8B are respectively a schematic illustration of one configuration of the micro-lens-and-compensator array in FIG. 7 in accordance with another embodiment of the present invention.

FIG. 8A shows one embodiment of the micro-lens-and-compensator array 322, wherein each micro-lens-and-compensator element (such as 322_2) is formed by a quadrupole or 4-pole lens. In the 4-pole lens, the inner surfaces of four electrodes form a circular shape in a radial cross-section, and therefore a round-lens field, a dipole field in any direction and a quadrupole field in one direction can be generated by appropriately setting the potentials of the four electrodes. For each 4-pole lens, the four electrodes are specifically oriented to match the direction of the quadrupole field with the direction of the astigmatism of the corresponding probe spot. For example in a radial cross-section, two electrodes of the micro-lens-and-compensator compensator element 322_3u are perpendicular to the vector 322_3u_2 directing from the primary optical axis to the center thereof.

Figure 8B:
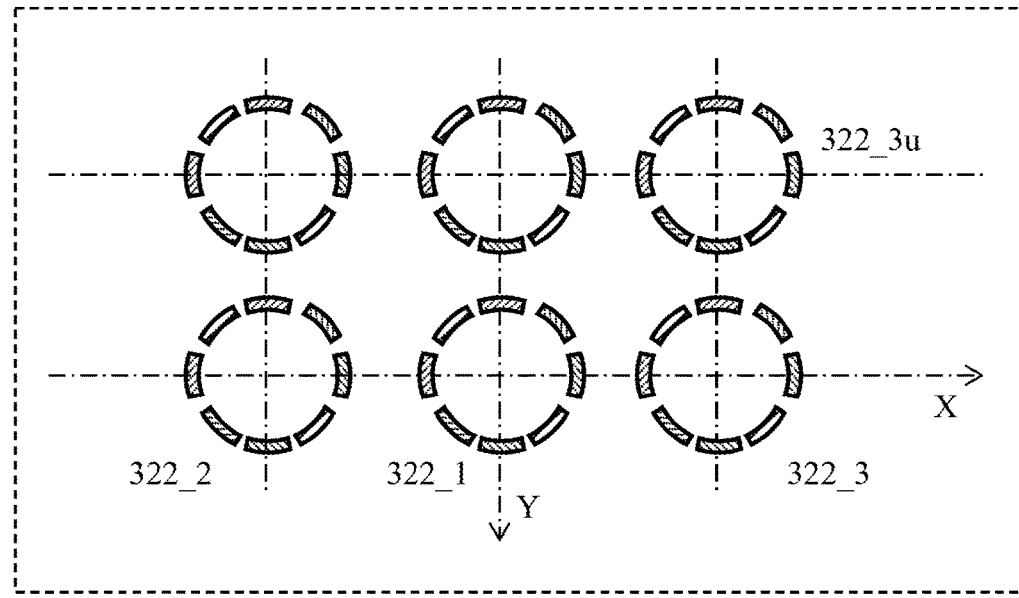

FIG. 8B shows another embodiment of the micro-lens-and-compensator array 322, wherein each micro-lens-and-compensator element (such as 322_2) is formed by an octupole or 8-pole lens. In the 8-pole lens, the inner surfaces of eight electrodes form a circular shape in a radial cross-section, and therefore a round-lens field, a dipole field in any direction and a quadrupole field in any direction can be generated by appropriately setting the potentials of the eight electrodes. Hence all the micro-lens-and-compensator elements can be configured to be same in structure and orientation. This is advantageous from the manufacturing point of view.

Figure 9:
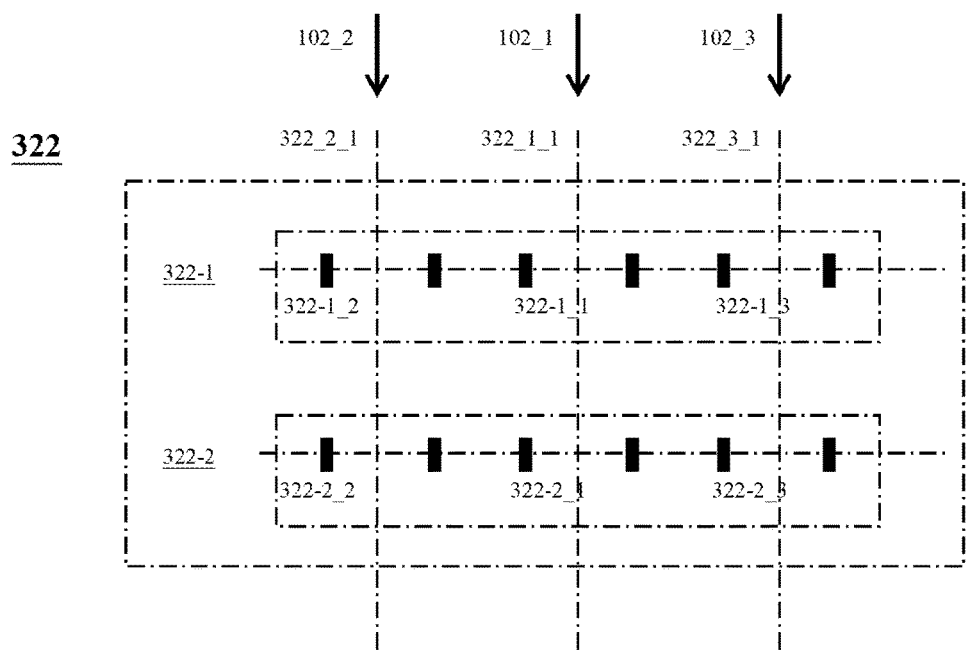
FIG. 9 is a schematic illustration of another configuration of the micro-lens-and-compensator array in FIG. 7 in accordance with another embodiment of the present invention.

Furthermore, for the micro-lens-and-compensator array 322 in FIG. 7, each micro-lens-and-compensator element can be formed by two or more micro-multiple-lenses. Each of the micro-multiple-lenses, for example, can be a 4-pole lens or 8-pole lens. FIG. 9 shows such an embodiment, wherein each micro-lens-and-compensator element is formed by one of upper micro-multipole-lenses 322-1_1, 322-1_2 and 322-1_3 in the upper layer 322-1 and one of lower micro-multipole-lenses 322-2_1, 322-2_2 and 322-

2_3 in the lower layer 322-2. In other words, each micro-lens-and-compensator element comprises a pair of the upper and lower micro-multipole-lenses aligned with each other. For example, the pair of the upper micro-multipole-lens 322-1_2 and the lower micro-multipole-lens 322-2_2 in FIG. 9 constitutes the micro-lens-and-compensator element 322_2 in FIG. 7. In one of the upper and lower micro-multipole-lenses in pair, the inner surfaces of the electrodes form a circular shape in a radial cross-section, and therefore a round-lens field can be generated.

Figure 10A:
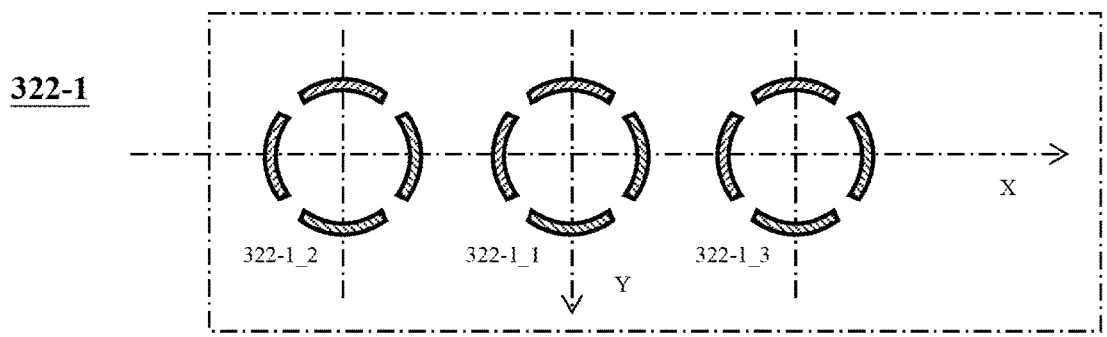
FIGS. 10A and 10B are schematic illustrations of one example of the micro-lens-and-compensator array in FIG. 9 in accordance with another embodiment of the present invention.
Figure 10B:
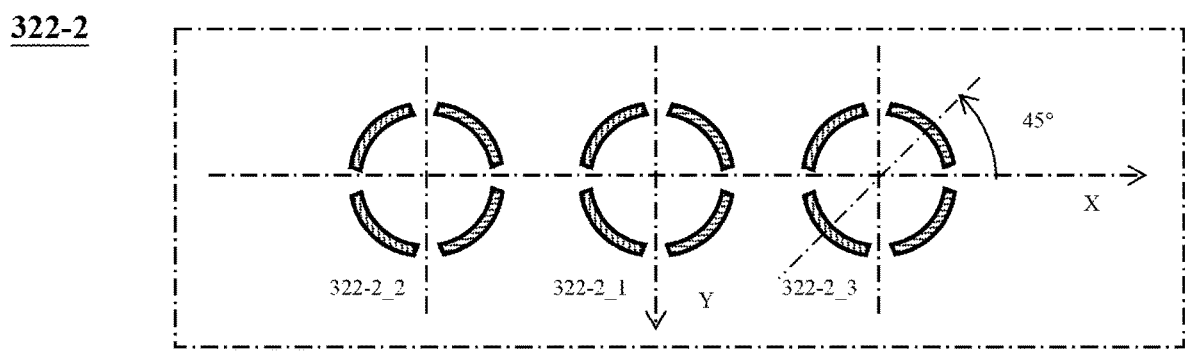

FIG. 10A and FIG. 10B show one example of the embodiment in FIG. 9, wherein the upper and lower micro-multipole-lenses in pair are two 4-pole lenses aligned with each other and have a 45° difference in azimuth or orientation. Each pair of upper and lower micro-multipole-lenses can generate a round-lens field, a dipole field and a quadrupole field both in any direction. Consequently, in each of the upper and lower layers, all the micro-multipole-lenses can be configured to be same in structure and orientation.

To operate one micro-lens-and-compensator element, a driving-circuit needs connecting with each electrode thereof. To prevent the driving-circuits from being damaged by the beamlets 102_1~102_3, the micro-lens-and-compensator array 322 can comprises one electric-conduction cover-plate which has a plurality of through-holes and is placed above the electrodes of all the micro-lens-and-compensator elements. Each through-hole is for the corresponding beamlet passing through. The fields of each micro-lens-and-compensator element are better within a limited range so as to avoid influencing the adjacent beamlets and the performance of the primary projection imaging system. Therefore it is better to use two electric-conduction shielding-plates to sandwich the electrodes of all the micro-lens-and-compensator elements, wherein each shielding-plate has a plurality of through-holes for the beamlets passing through.

Figure 11A:
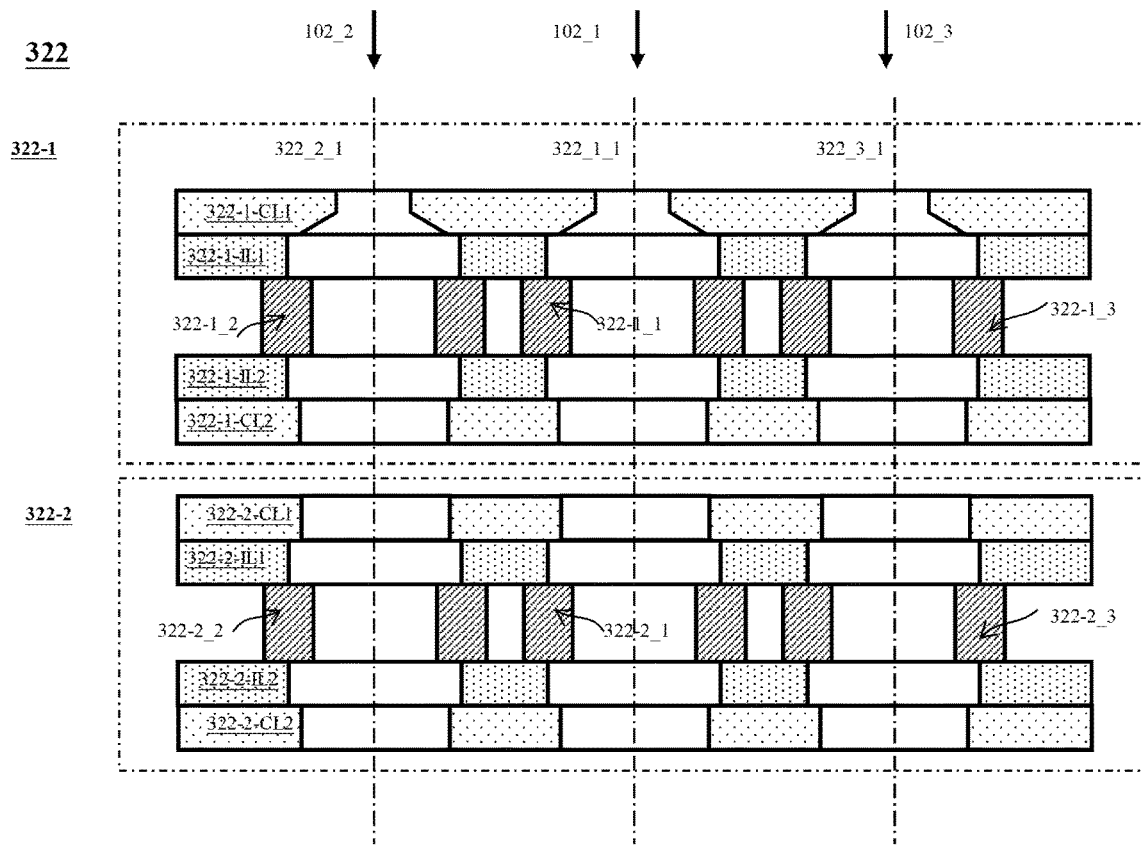
FIG. 11A and FIG. 11B are respectively a schematic illustration of one configuration of the micro-lens-and-compensator array in FIG. 7 in accordance with another embodiment of the present invention.

FIG. 11A shows one way to implement the foregoing improvement measures in the embodiment in FIG. 9. In the upper layer 322-1, the first-upper and the first-lower electric-conduction plates 322-1-CL1 and 322-1-CL2 are respectively placed above and below the upper micro-multipole-lenses 322-1_1, 322-1_2 and 322-1_3. The first-upper electric-conduction plate 322-1-CL1 functions as both the foregoing cover-plate and the shielding-plate, and the first-lower electric-conduction plate 322-1-CL2 functions as the foregoing shielding-plate. The first-upper insulator plate 322-1-IL1 with three first-upper orifices and the first-lower insulator plate 322-1-IL2 with three first-lower orifices support the upper micro-multipole-lenses 322-1_1, 322-1_2 and 322-1_3 and therefore make the upper layer 322-1 more stable in configuration. The lower layer 322-2 has a similar configuration to the upper layer 322-1. The second-upper electric-conduction plate 322-2-CL1 functions as the foregoing cover-plate and the shielding-plate, and the second-lower electric-conduction plate 322-2-CL2 functions as the foregoing the shielding-plate. The second-upper insulator plate 322-2-IL1 with three second-upper orifices and the second-lower insulator plate 322-2-IL2 with three second-lower orifices support the lower micro-multipole-lenses 322-2_1, 322-2_2 and 322-2_3.

In each layer in FIG. 11A, the radial dimensions of the through-holes are preferred smaller than the radial dimensions of the orifices so as to avoid charging-up on the inner sidewalls thereof, and smaller than the inner radial dimensions of the electrodes of the micro-multipole-lenses so as to more efficiently reduce the fields leaking out. To reduce the possibility of beamlet incurring electron scattering, each through-hole in the first-upper and second-upper electric-conduction plates is preferred in an upside-down funnel shape (i.e. the small end is on the beamlet incident side thereof).

Figure 11B:
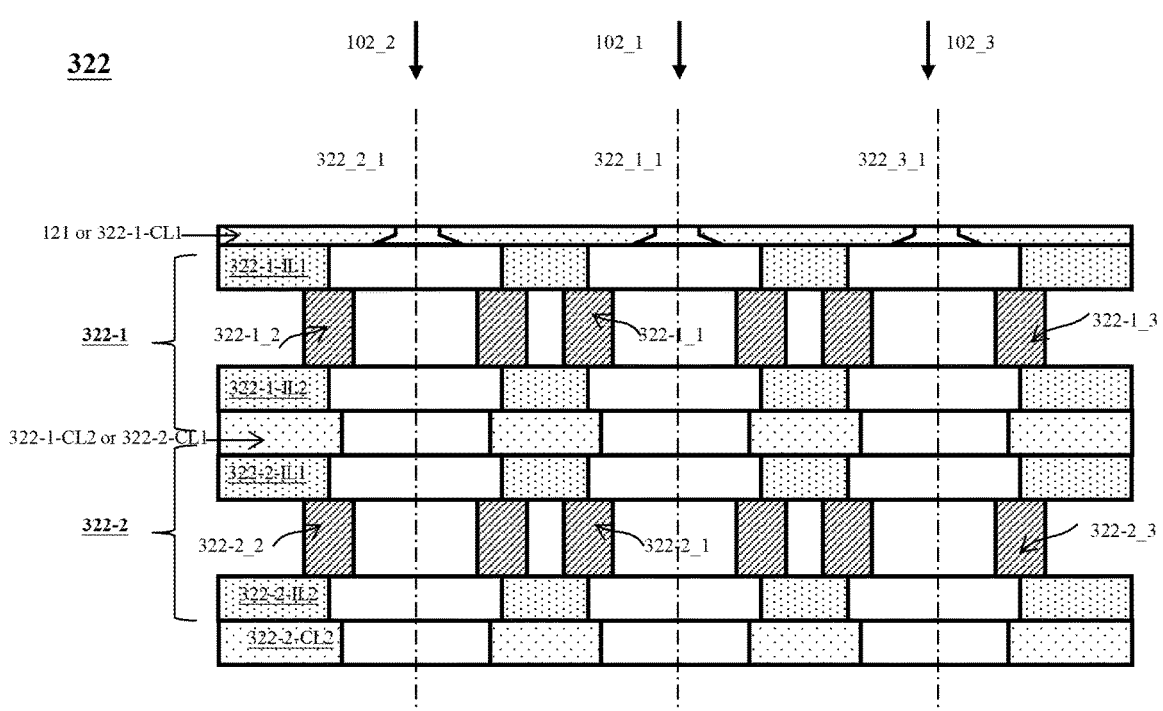

The beamlet-forming means 121 in FIG. 7 and the embodiment of the image-forming means 322 in 11A can be compacted for simplifications in structure and manufacturing. In FIG. 11B, the beamlet-forming means 121 and the first-upper electric-conduction plate 322-1-CL1 are combined, and the first-lower electric-conduction plate 322-1-CL2 and the second-upper electric-conduction plate 322-2-CL1 are combined.

Figure 12:
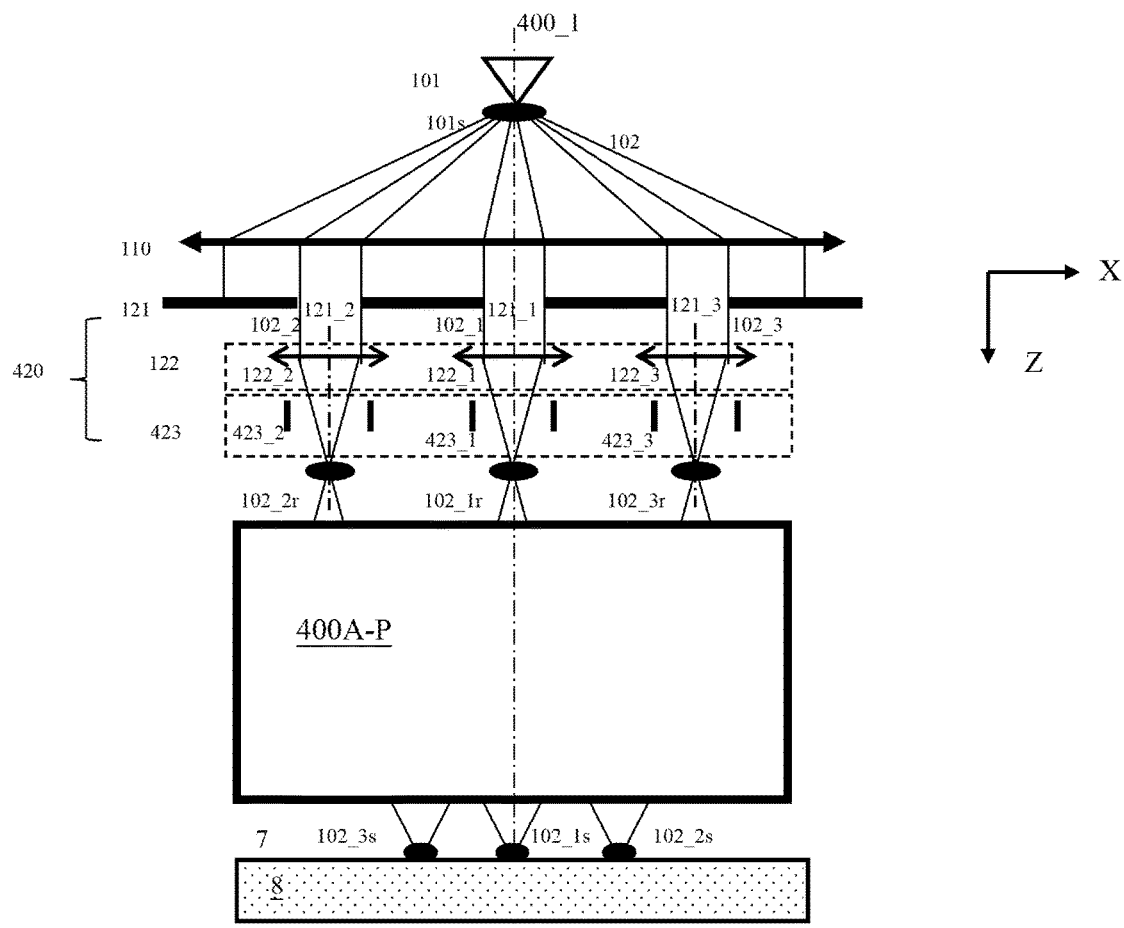
FIG. 12 a schematic illustration of a new multi-beam apparatus in accordance with another embodiment of the present invention.

One embodiment 400A of another new multi-beam apparatus employing the second method is shown in FIG. 12. In comparison with the prior art in FIG. 2A, the source-conversion unit 420 further comprises one aberration-compensation means 423 or one micro-compensator array 423 with a plurality of micro-compensator elements (423_1, 423_2 and 423_3). The micro-compensator array 423 can be placed above or below the image-forming means 122. Each of the micro-lenses (122_1, 122-2 and 122_3) in the image-forming means 122 can be formed by the conventional way mentioned in "BACKGROUND OF THE INVENTION", or by one or more individual annular electrodes with round inner surfaces. Each micro-compensator element is aligned with one corresponding micro-lens, and can be formed by one or more micro-multipole-lenses mentioned above (as shown in FIG. 8A, FIG. 8B, FIG. 10A, FIG. 10B, FIG. 11A and FIG. 11B) to generate the fields for compensating the field curvature, astigmatism, the distortion of the corresponding probe spot. The voltages of all the electrodes in each micro-compensator element are much lower than those in the micro-lens-and-compensator array in FIG. 7, and therefore are easy and safe for adjustment.

Figure 13:
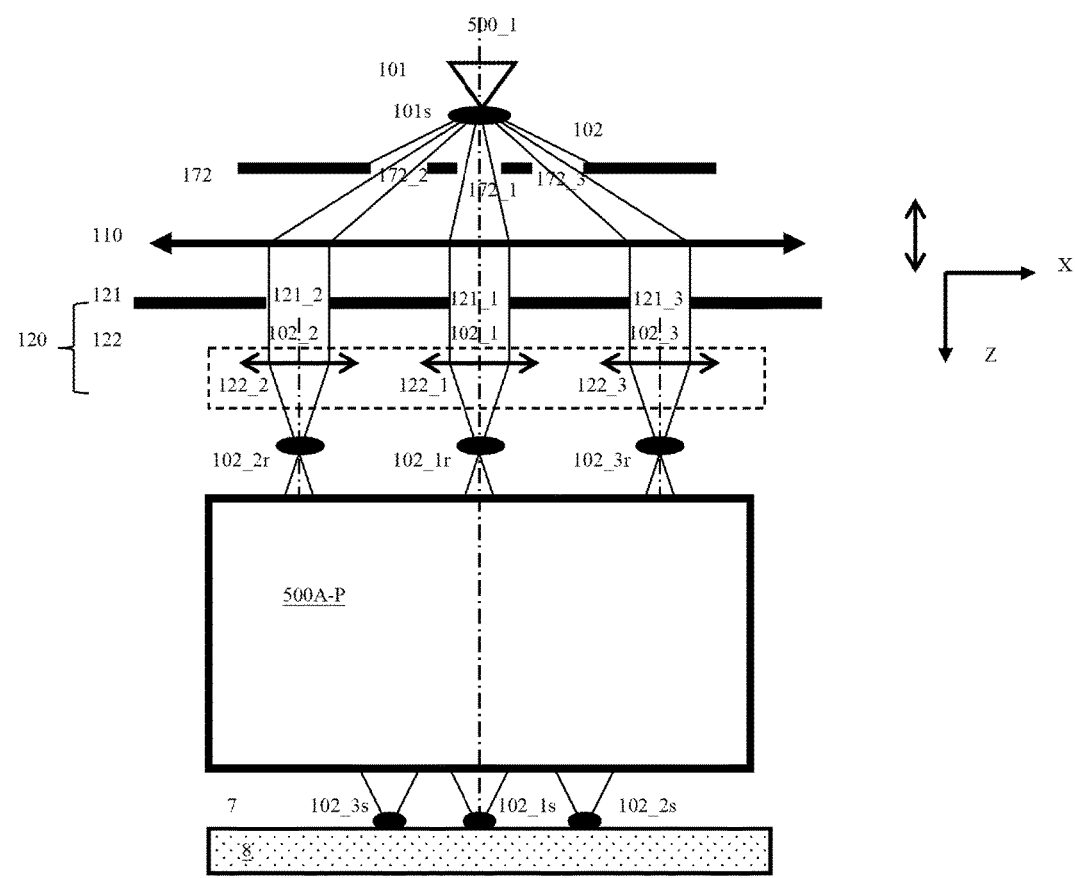
FIG. 13 a schematic illustration of a new multi-beam apparatus in accordance with another embodiment of the present invention.

One embodiment 500A of another new multi-beam apparatus employing the third method is shown in FIG. 13. In comparison with the prior art in FIG. 2A, a pre-beamlet-forming means 172 with a plurality of beamlet-forming apertures is employed to reduce Coulomb effect in the area above the source-conversion unit 120. The plurality of beamlets is only a small part of the primary-electron beam 102, and the other part thereof is not useful but harmful for the forming of the plurality of probe spots on the sample surface 7. Conventionally a main aperture plate (not shown here) with one larger opening is placed close to the single electron source 101 to cut off the peripheral electrons of the primary-electron beam 102 as earlier as possible. Even so, the current of the primary-electron beam 102 in the area above the source-conversion unit 120 is still very large; hence it is better to cut off the electrons which will not be used in the plurality of beamlets (102_1~102_3) as soon as possible. The pre-beamlet-forming means 172 is placed as close to the single electron source 101 as possible, the three beamlet-forming apertures 172_1, 172_2 and 172_3 cut the wide primary-electron beam 102 into three beamlets 102_1, 102_2 and 102_3 much earlier than the beam-limit openings 121_1, 121_2 and 121_3 do in FIG. 2A. The beam-limit openings 121_1, 121_2 and 121_3 cut off the peripheral electrons of the beamlets 102_1, 102_2 and 102_3 formed by the pre-beamlet-forming means 172 respectively, and finally limit the currents thereof.

Figure 14:
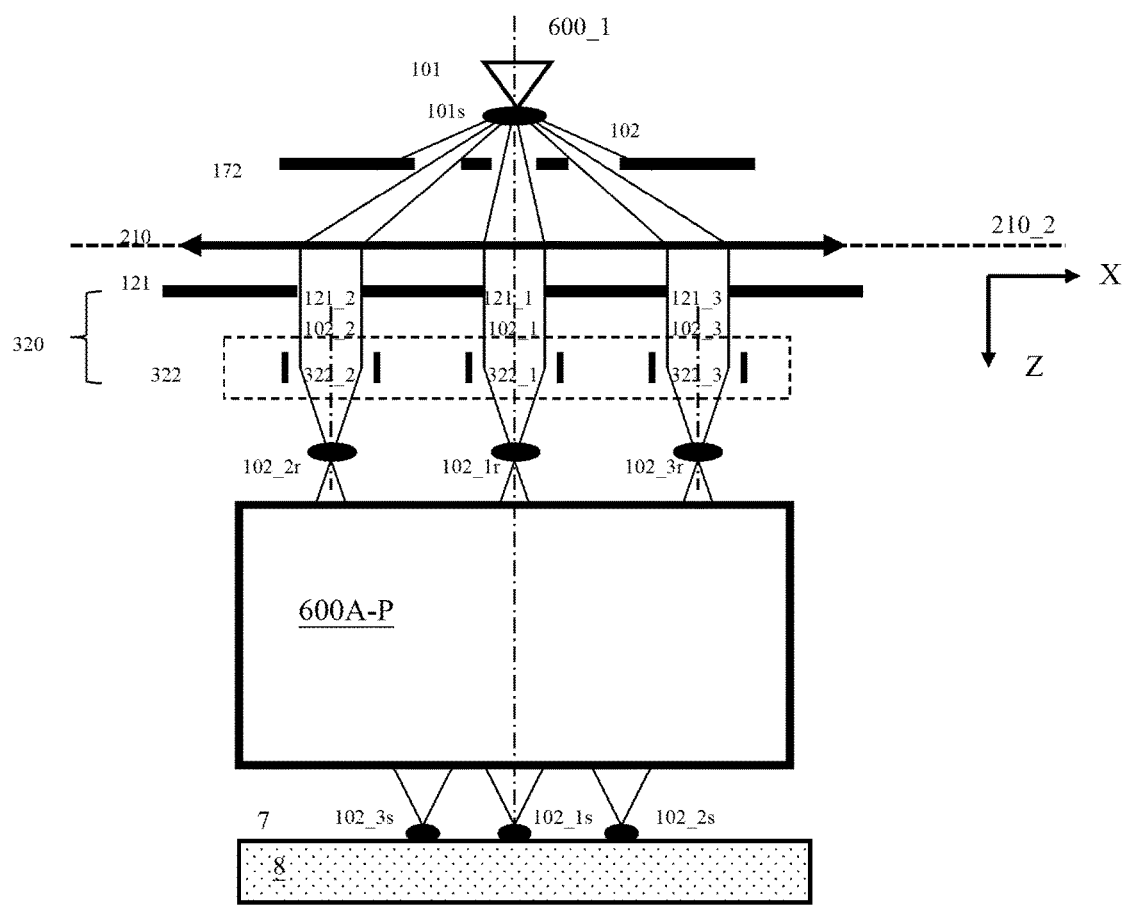
FIG. 14 a schematic illustration of a new multi-beam apparatus in accordance with another embodiment of the present invention.

Obviously, every two or all of the foregoing three methods and their embodiments can be used together in a new multi-beam apparatus. One embodiment 600A of a new multi-beam apparatus employing the three methods is shown in FIG. 14. One pre-beamlet-forming means 172 shown in FIG. 13 is placed above one movable collimating lens 210 shown in FIG. 3A, and one source-conversion unit 320 shown in FIG. 7 is used to form the plurality of parallel images (102_1r, 102_2r and 102_3r) of the single electron source crossover 101 and compensate the off-axis aberrations of the plurality of probe spots (102_1s, 102_2s and 102_3s).

In summary, this invention proposes a new multi-beam apparatus which provides both high resolution and high throughput for observing a sample in flexibly varying observing conditions, and therefore can function as a yield management tool to inspect and/or review defects/particles on wafers/masks in semiconductor manufacturing industry. On the one hand, the new multi-beam apparatus uses a movable collimating lens to vary the currents of the plurality of probe spots without incurring pitch variations thereof. On the other hand, the new multi-beam apparatus employs a new source-conversion unit to form the plurality of parallel real images of the single electron source and compensate off-axis aberrations of the plurality of probe spots with respect to the currents and the landing energies thereof, or add an aberration-compensation means to one conventional source-conversion unit to perform the foregoing compensation. Furthermore, a pre-beamlet-forming means is placed close to the single electron source to reduce the strong Coulomb effect due to the primary-electron beam as soon as possible.

Although the present invention has been explained in relation to its preferred embodiment, it is to be understood that other modifications and variation can be made without departing the spirit and scope of the invention as hereafter claimed.

What is claimed is:

1. A multi-beam apparatus for observing a surface of a sample, the apparatus comprising:
an electron source that is a source of electrons of an electron beam and that is aligned with a primary optical axis of the apparatus; and
an adjustable collimating lens having a principal plane and configured to change paths of the electrons of the electron beam, wherein the adjustable collimating lens is aligned with the primary optical axis, and wherein the principal plane is moveable along the primary optical axis to vary currents of a plurality of beamlets that are derived from the electron beam.

2. The apparatus of claim 1, wherein the adjustable collimating lens comprises a plurality of magnetic lenses that are positioned along the primary optical axis.

3. The apparatus of claim 2, wherein the principal plane of the adjustable collimating lens is moveable along the primary optical axis by adjusting excitations of at least two of the plurality of magnetic lenses.

4. The apparatus of claim 1, wherein the adjustable collimating lens comprises a plurality of annular electrodes that are positioned along the primary optical axis.

5. The apparatus of claim 4, wherein the principal plane of the adjustable collimating lens is moveable along the primary optical axis by adjusting excitations of at least two of the plurality of annular electrodes.

6. The apparatus of claim 1, wherein the adjustable collimating lens comprises a magnetic lens and an annular electrode, wherein the magnetic lens and the annular electrode are positioned along the primary optical axis.

7. The apparatus of claim 6, wherein the principal plane of the adjustable collimating lens is moveable along the primary optical axis by adjusting excitations of the magnetic lens and the annular electrode.

8. The apparatus of claim 1, further comprising:
a pre-beamlet-forming array including a plurality of beamlet-forming apertures to divide the electron beam into the plurality of beamlets.

9. The apparatus of claim 8, wherein the pre-beamlet-forming array includes a plurality of beamlet-forming apertures to trim the electron beam into the plurality of beamlets.

* * * * *